(12) United States Patent
Katakura

(10) Patent No.: US 6,287,731 B1
(45) Date of Patent: Sep. 11, 2001

(54) METHODS FOR MAKING MICROLITHOGRAPHY MASKS UTILIZING TEMPERATURE CONTROL

(75) Inventor: Norihiro Katakura, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/320,197

(22) Filed: May 26, 1999

(30) Foreign Application Priority Data

May 28, 1998 (JP) .................................................. 10-147349

(51) Int. Cl.[7] ........................................................ G03F 9/00
(52) U.S. Cl. ..................................................................... 430/5
(58) Field of Search ................................ 430/5, 296, 30, 430/330; 378/34, 35

(56) References Cited

U.S. PATENT DOCUMENTS 5,275,237 * 1/1994 Rolfson et al. ...................... 165/80.5
5,773,201 * 6/1998 Fujimura et al. .................... 430/329
5,888,699 * 3/1999 Okino ................................... 430/296

* cited by examiner

Primary Examiner—Mark F. Huff
Assistant Examiner—Saleha R. Mohamedulla
(74) Attorney, Agent, or Firm—Klarquist Sparkman, Campbell Leigh & Whinston LLP

(57) ABSTRACT

Apparatus and methods for making charged-particle-beam microlithography masks are provided. The apparatus and methods provide consistent maintenance of the temperature of a mask workpiece below a specified temperature during etch processes performed to make the mask. A workpiece (comprising a substrate upon which a membrane is formed) is placed in thermal contact with a temperature-controlled support. The workpiece is cooled as the support withdraws heat from the workpiece by thermal conduction. In a second aspect of the methods provided, the etch process is paused at regular intervals for set periods of time to provide the workpiece with a cooling period. The etch process is paused for a cooling period before the temperature of the workpiece increases to a level that may cause damage to the mask membrane and/or mask pattern. After the workpiece has cooled, the etch process can be resumed until the next cooling period or until the etch process is completed.

9 Claims, 2 Drawing Sheets

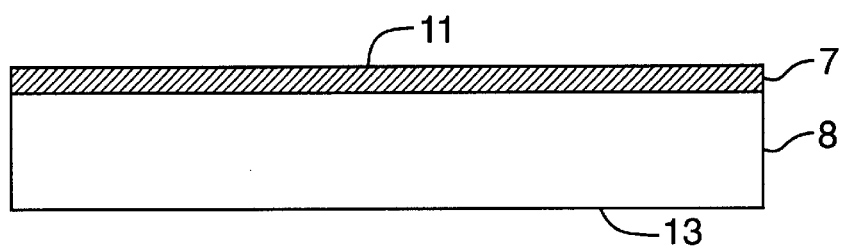
FIG. 1(a)
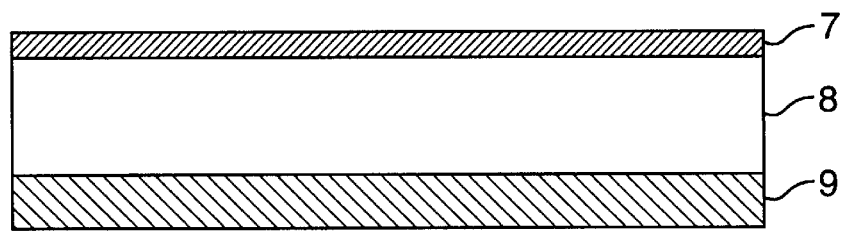
FIG. 1(b)
FIG. 1(c)
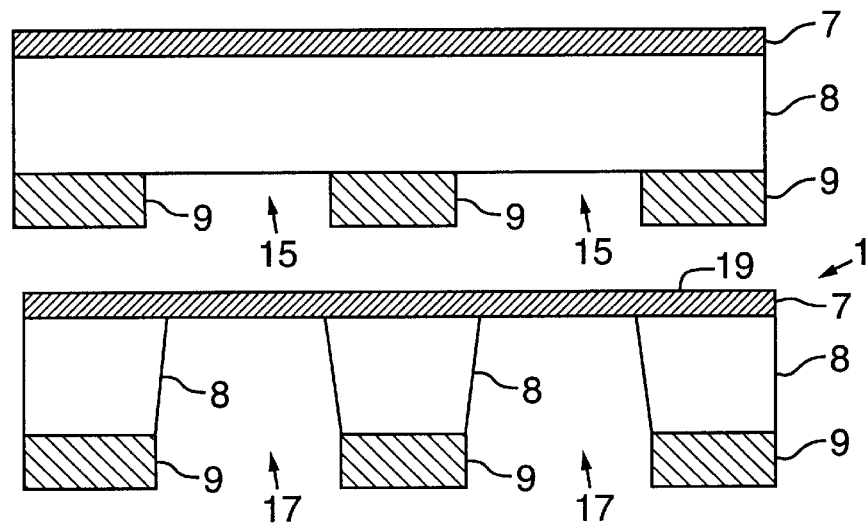
FIG. 1(d)
FIG. 1(e)
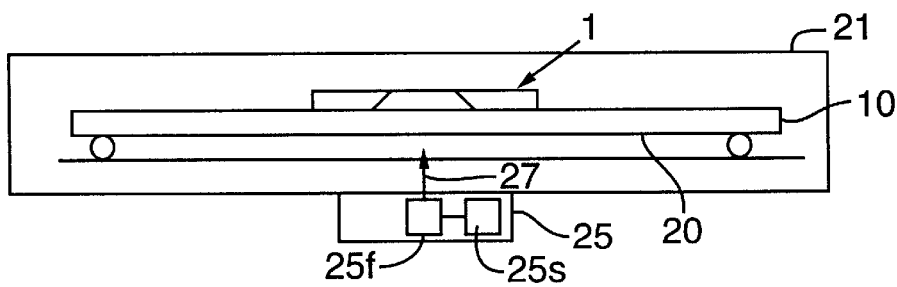
FIG. 1(f)
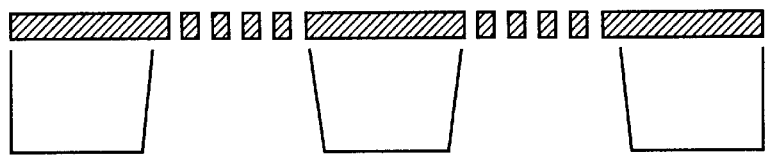

METHODS FOR MAKING MICROLITHOGRAPHY MASKS UTILIZING TEMPERATURE CONTROL

FIELD OF THE INVENTION

The present invention pertains to apparatus and methods for the manufacture of microlithography masks.

BACKGROUND OF THE INVENTION

Recent developments in semiconductor integrated-circuit technology have been remarkable with the miniaturization of the constituent semiconductor elements and trends toward increased integrated-circuit density. Up to the present, so-called optical lithography steppers have conventionally been used for performing lithographic exposure (projection-transfer) of integrated-circuit patterns onto semiconductor wafers. Unfortunately, current optical lithography techniques are (or soon will be) unable to provide the image resolution necessary to satisfy anticipated demands for ever decreasing miniaturization of semiconductor elements and increases in integrated-circuit density. Consequently, effort has been expended to develop microlithographic equipment employing a charged particle beam (e.g., electron beam or ion beam) or an X-ray beam rather than a light (ultraviolet) beam. That is, a charged particle beam or X-ray beam is used to project a pattern, defined by a mask or reticle (both terms are used interchangeably herein), with demagnification, onto a sensitive substrate, such as a semiconductor wafer coated with a suitable resist.

One type of mask used in conventional charged-particle-beam (CPB) projection-transfer systems is a stencil mask. Referring to FIG. 3, a stencil mask typically comprises a silicon membrane 6 having through-holes 6a formed therein. The silicon membrane 6 is formed from a silicon substrate 5. The silicon substrate 5 acts as support for the membrane. The through-holes 6a, together with the remaining mask membrane, define a pattern. Stencil masks are frequently used in ion-beam lithography and cell-projection electron-beam lithography apparatus.

Referring to FIG. 2, full-size X-ray lithography masks typically comprise a patterned material 3 (typically tantalum) formed on a silicon nitride membrane 4. The silicon nitride membrane 4 is formed on and supported by a silicon substrate 2.

As used herein, a "mask workpiece" is a mask in the process of manufacture. Mask manufacture typically involves one or more anisotropic etching steps that facilitate the formation of the pattern defined by the mask.

During manufacture of masks such as shown in FIGS. 2–3, process temperatures typically increase to levels that result in damage to the mask membrane or in inaccurate mask patterns. If the mask workpiece is not maintained below a specific temperature level during manufacture, certain steps may not be executed properly. For example, excessive temperature may cause an anisotropic etch process to become isotropic, resulting in undesirable angled pattern features that reduce the mask's resolution. Thus, the mask workpiece should be maintained below a specific temperature during all steps of the mask-manufacturing process (the specific temperature is determined by the particular etching process and etching equipment used to make the mask). Maintaining the temperature of the mask workpiece below such a level yields stable etch results and allows performance of anisotropic etching. Accordingly, the resolution of the resulting mask pattern is increased if the temperature of the mask workpiece is controlled as the mask is formed (i.e., during the etch processes).

Conventional temperature control for dry-etch processes involves control of the temperature of the mask membrane as it is etched (i.e., membrane 4 in FIG. 2 and membrane 6 in FIG. 3). A stream of coolant gas (at a pressure of several tens of mTorr) is flowed directly on the lower surface of the membrane (i.e., membrane surface 4' in FIG. 2 and membrane surface 6' in FIG. 3) during etching. stencil masks in which through-holes 6a are etched in the thin membrane 6 (or, as shown in FIG. 2, where a patterned material 3 formed on the membrane 4 is etched), the membrane is often deformed or destroyed due to the pressure of the coolant gas impinging on it.

Additionally, conventional temperature-maintenance methods are often ineffective because the coolant gas flows through the through-holes 6a as the holes are being etched. As a result, the gas does not act to sufficiently and consistently cool the mask workpiece. Accordingly, conventional methods of maintaining the temperature of a mask workpiece during manufacture do not consistently maintain the temperature of the mask workpiece below a specified temperature during performance of the etch processes necessary to form the mask.

Previous attempts to resolve the problem of damage to the membrane by the cooling gas include strengthening the membrane (i.e., providing a thicker membrane) to allow for direct cooling of the membrane. Alternatively, membranes have been strengthened by application of a resin (e.g., a resist) to the lower surface of the membrane. Such cooling methods are insufficient to maintain the mask below required temperature levels. Further, whereas thinner membranes provide better pattern resolution, thinner membranes are less resistant to thermal damage than thicker membranes. Moreover, application (and subsequent removal) of the reinforcing resin on the membrane increases the amount of processing required to manufacture a mask and increases the risk of damaging the mask membrane.

Accordingly, there is a need for methods for making charged-particle-beam microlithography masks in which the methods provide consistent cooling of the mask workpiece especially during etching and other steps as required without causing damage to the resulting mask.

SUMMARY OF THE INVENTION

In light of the foregoing deficiencies in the prior art, apparatus and methods for making charged-particle-beam (CPB) microlithography masks are provided. The apparatus and methods provide for consistent maintenance of the temperature of a mask workpiece during performance of etch processes (and/or other process steps as required) used to form the mask.

According to a first aspect of the invention, methods are provided that include placing a mask workpiece, comprising a substrate upon which a membrane is formed, on a temperature-controlled support. The mask workpiece is not secured to the support. The mask workpiece is cooled by conduction of heat to the temperature-controlled support. As a result, the mask membrane is consistently cooled but is not damaged by the flow of coolant gas during the etch processes. Because the mask workpiece need not be secured to the support, removal of the workpiece from the support does not add to the process time necessary to make the mask.

According to another aspect of the invention, mask-manufacturing apparatus are provided. A representative embodiment of such an apparatus includes a support that preferably comprises a material having a relatively high thermal conductivity, such as a conventional silicon wafer. A mask workpiece is placed on (so as to contact), but is not secured to, an upper surface of the support. The apparatus further includes a dry-etch device in which the mask workpiece and support are placed. The apparatus further includes a cooling mechanism that includes a coolant source and a flow device. The coolant source is a supply of fluid, comprising a gas, a liquid, or a mixture thereof. The flow device is operable to direct a flow of coolant in a direction toward (preferably directly on) the lower surface of the support, thereby cooling the support and thus the mask workpiece.

According to yet another aspect of the invention, methods are provided that include pausing the etch process at regular intervals for predetermined periods of time (i.e, providing a cooling period). The etch processes are paused for a cooling period before the temperature of the mask workpiece increases to a level that may cause damage to the mask membrane and/or material being patterned thereon. After the mark workpiece has cooled, the etch process is resumed until the next cooling period.

The foregoing and other objects, features, and advantages of the apparatus and methods provided herein will become more apparent from the following detailed description that proceeds with reference to the accompanying drawings.

BRIEF DESCRIPTION OF THE DRAWINGS

FIGS. 1(a)–1(f) show, in respective schematic elevational sections, certain steps of an embodiment of an apparatus and method for cooling a mask membrane during fabrication of a charged-particle-beam (CPB) mask.

DETAILED DESCRIPTION

Figure 2:
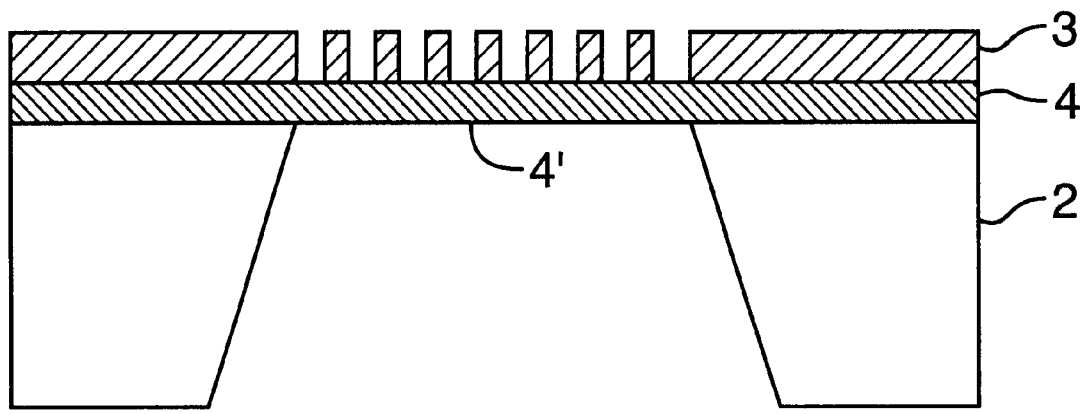
FIG. 2 is a schematic elevational section of a CPB mask.
Figure 3:
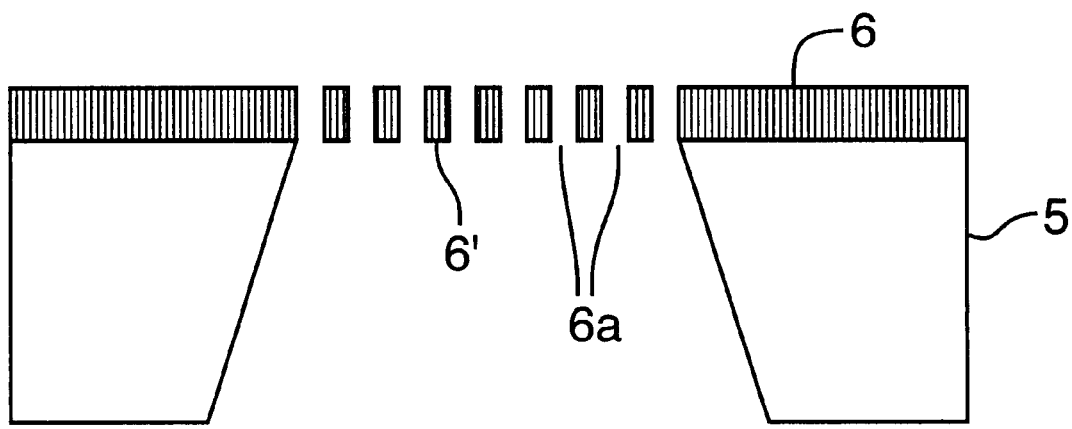
FIG. 3 is a schematic elevational section of another type of a CPB mask.

Apparatus and methods for manufacturing a charged-particle-beam (CPB) mask are provided. The apparatus and methods provide for consistent maintenance of the temperature of a mask workpiece below a selected temperature. More specifically, the apparatus and methods provide for maintenance of the temperature of a mask workpiece as etch processes are performed on the mask workpiece to form a mask. Such a mask workpiece comprises a membrane and substrate and possibly also a material forming a pattern on the mask membrane.

According to a first embodiment, a mask workpiece is placed in contact with a temperature-controlled support. The mask workpiece is not mechanically, adhesively, electrostatically, or otherwise secured to the support but is merely placed in contact with the support. The mask workpiece is thereby cooled by conduction of heat from the mask workpiece to the temperature-controlled support. As a result, the mask membrane is cooled but is not damaged by the flow of a coolant directed toward or onto the membrane, as in prior art methods.

According to a second embodiment, an etch process is temporarily halted at regular intervals for set periods of time (i.e, the etch process is provided with one or more cooling periods). During such a pause, the mask workpiece is allowed to cool before the temperature of the mask workpiece increases to a level that may result in damage to the mask membrane. After the mask workpiece has sufficiently cooled, the etch process can be resumed.

More than one cooling period may be required during the etch process.

More specifically, referring to FIG. 1(a), a thin membrane 7 is formed or deposited on a substrate 8. The substrate 8 typically comprises a conventional silicon wafer. The membrane 7 is preferably made of silicon (or other suitable crystalline material) in which atoms of an impurity (dopant) have been incorporated. The membrane 7 may comprise, for example, doped silicon, such as silicon doped with boron and preferably has a thickness of about 2 $\mu$m.

By way of example, the concentration of boron dopant in the silicon membrane 7 is about $1 \times 10^{20}$ atoms/cm$^3$ (i.e., about 0.5 atomic percent). The membrane 7 may be doped using conventional doping techniques, such as ion implantation.

Alternatively, a portion of the silicon substrate 8 at the upper surface 11 may be doped to a defined depth to form the membrane 7.

A silicon nitride film 9 is formed or deposited on a lower surface 13 of the substrate 8 (FIG. 1(b)). The silicon nitride film 9 will act as an etch mask during subsequent etching of the substrate 8. Specifically, the silicon nitride film 9 acts as a mask covering portions of the substrate 8 that will ultimately form a support for the mask membrane 7. To such end, a portion of the silicon nitride film 9 is patterned and etched to form openings 15 (FIG. 1(c)). The exposed portions of the substrate 8 are etched to membrane 7 utilizing selective differences in etching sensitivity of the substrate 8 versus the silicon nitride film 9 (FIG. 1(d)). For example, if the substrate 8 comprises silicon, the substrate 8 may be selectively etched using an aqueous solution of potassium hydroxide (which will not etch the silicon nitride film 9). Etching of the exposed portions of the substrate 8 forms openings 17 that expose respective portions of the underlying membrane 7 (FIG. 1(d)).

The mask workpiece 1 (comprising the patterned membrane layer 7, substrate 8, and silicon nitride layer 9 as shown in FIG. 1(d)) is then placed in contact with a support 10 (FIG. 1(e)). The support 10 preferably comprises a material having a relatively high thermal conductivity (e.g., a conventional silicon wafer) such that the mask workpiece 1 is cooled by conduction of heat from the mask workpiece to the support 10. The apparatus further includes a dry-etch device 21. The mask workpiece 1 and support 10 are placed in the dry-etch device 21. The dry etch device 21 includes a substrate-cooling mechanism 25. The surface of the support 10 is preferably covered with a layer of resist to ensure that the support is not etched during etching of the membrane 7.

The cooling mechanism 25 preferably includes a fluid coolant source 25s. The fluid coolant may comprise a gas, a liquid, or mixtures thereof. For example, the fluid coolant may comprise helium gas or water. The cooling mechanism 25 further includes a flow device 25f to regulate and direct a stream of coolant from the source 25s directly on or toward the support 10. Specifically, the coolant is directed by the flow device 25f to flow in a direction toward (preferably directly on) the lower surface 20 of the support 10, as shown in FIG. 1(e), thereby cooling the support. Because the support 10 comprises a relatively thermally conductive material, the mask workpiece 1 placed in contact with the support 10 is cooled by thermal conduction. The coolant does not flow directly on to the membrane 7.

A stencil pattern is then preferably etched in the membrane 7. For example, a layer of resist may be applied to the membrane 7 and patterned by microlithography. Plasma etching or low-temperature ion-etching may be used to pattern the membrane 7. Alternatively, as shown in FIG. 2, a thin patterned layer 3 may be deposited on a membrane 4, after which the layer 3 is etched to form the desired mask pattern.

By preventing coolant fluid from flowing directly against the membrane 7, the membrane is not damaged during manufacture, in contrast to the membranes of masks made using prior-art methods and apparatus. Also, because the flow of coolant fluid is directed according to the invention toward the support 10 rather than directly on to the membrane 7, the coolant does not pass through the through-holes etched in the membrane 7 instead of cooling the mask workpiece. As a result, unlike prior-art mask manufacturing methods and apparatus, the present apparatus and methods provide for a steady and consistent cooling of the mask workpiece as the membrane (or patterned material on the membrane) is etched.

According to a second embodiment of mask manufacturing methods, an etching process performed on a mask substrate is regularly paused to allow the mask workpiece to cool. More particularly, as the membrane is being etched, the etch process is paused at regular intervals for set periods of time (i.e., one or more workpiece cooling periods are provided). Accordingly, the etch process is temporarily stopped before the temperature of the mask workpiece has increased to a temperature that may result in damage to the mask membrane (i.e., a threshold temperature). After the mask workpiece has cooled, the etch process is resumed.

For example, if a silicon membrane is being etched to from a mask, the etch process may be performed for a period of about 30 seconds using an etchant gas, such as $Cl_2+CHF_3$. The etch process is then stopped for a period of time (e.g., of about five minutes) to allow the mask workpiece to cool sufficiently. The etch process is then resumed for another period of time (e.g., about 30 seconds). Further interruption is performed during etching. Etching of the membrane is performed to a specified depth by appropriate repetition of this process. Thus, a stencil mask for use with a CPB microlithography apparatus is completed (FIG. 1(f)).

Suitable etch process times and cooling periods may be determined by persons skilled in the art, based on parameters, such as the size, shape, and material of the membrane being processed. Thus, by pausing and then resuming the etch process, the membrane will be maintained below a temperature that would otherwise damage the mask membrane. Because the mask membrane does not have to be precisely cooled, the membrane can simply be placed on the support 10 (so as to contact the support 10), without actually securing the workpiece mechanically, electrostatically, adhesively, or the like, to the support.

Further, cooling methods and apparatus as discussed above may be used separately or in combination to cool the mask membrane during etching. That is, the mask membrane may be cooled by placing the mask workpiece on a cooled support and/or by pausing and resuming the etch process at regular intervals, or both. Either or both methods and apparatus allow the mask workpiece to be effectively and consistently cooled without damaging the mask membrane or increasing process time.

Having illustrated and described the principles of the invention with specific embodiments, it should be apparent to those skilled in the art that the invention can be modified in arrangement and detail without departing from such principles. I claim all the modifications coming within the spirit and scope of the following claims.

What is claimed is:

1. In a method for manufacturing a mask for charged-particle-beam microlithography, a method of controlling a temperature of a mask workpiece below a threshold temperature above which mask damage could result, the method comprising:

(a) providing a mask workpiece comprising a substrate having a patterned membrane on a surface thereof, the substrate providing support for the membrane;

(b) placing the substrate of the mask workpiece in thermal contact with an upper surface of a support;

(c) directing a flow of a fluid coolant against a lower surface of the support so as to withdraw heat from the mask workpiece;

(d) etching the membrane while withdrawing heat from the mask workpiece;

(e) pausing etching of the membrane to allow reduction of the temperature of the mask workpiece; and (f) resuming etching of the membrane.

2. The method of claim 1, wherein the etching is paused and resumed at regular intervals of time.

3. The method of claim 1, wherein the fluid coolant is a gas.

4. The method of claim 1, wherein the fluid coolant is a liquid.

5. The method of claim 1, wherein the fluid coolant is water.

6. The method of claim 1, wherein the membrane includes a patterned material thereon, and wherein the patterned material is etched.

7. The method of claim 1, wherein the mask workpiece is not mechanically, adhesively or electrostatically secured to the support.

8. In a method for manufacturing a mask for charged-particle-beam microlithography, a method for controlling a temperature of a mask workpiece below a threshold temperature above which mask damage would result, the method comprising:

(a) providing a mask workpiece comprising a substrate having a patterned membrane on a surface thereof, the substrate providing support for the membrane;

(b) etching the membrane to form a mask pattern;

(c) pausing etching of the membrane to allow reduction of the temperature of the mask workpiece; and (d) resuming etching of the membrane.

9. The method of claim 8, wherein the etching is paused and resumed at regular intervals of time.

* * * * *

UNITED STATES PATENT AND TRADEMARK OFFICE
CERTIFICATE OF CORRECTION

PATENT NO. : 6,287,731 B1 Page 1 of 1
DATED : September 11, 2001
INVENTOR(S) : Norihiro Katakura It is certified that error appears in the above-identified patent and that said Letters Patent is hereby corrected as shown below:

Column 2,
Line 7, "stencil" should be -- In the case of stencil --.

Column 3,
Line 18, "mark workpiece" should be -- mask workpiece --.

Column 4,
Line 42, "dry etch" should be -- dry-etch --.

Column 5,
Line 26, "from" should be -- form --.
Line 27, "$CI_2+CHF_3$" should be -- $Cl_2+CHF_3$ --.

Signed and Sealed this

Eighteenth Day of February, 2003

JAMES E. ROGAN
*Director of the United States Patent and Trademark Office*